US008952488B2

(12) United States Patent
Yang et al.

(10) Patent No.: US 8,952,488 B2
(45) Date of Patent: Feb. 10, 2015

(54) LOW COST ANTI-FUSE STRUCTURE

(71) Applicant: International Business Machines Corporation, Armonk, NY (US)

(72) Inventors: Chih-Chao Yang, Glenmont, NY (US); Stephen M. Gates, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/061,403

(22) Filed: Oct. 23, 2013

(65) Prior Publication Data
US 2014/0048905 A1   Feb. 20, 2014

Related U.S. Application Data

(63) Continuation of application No. 13/552,293, filed on Jul. 18, 2012, now Pat. No. 8,637,957.

(51) Int. Cl.
*H01L 23/525* (2006.01)
*H01L 27/112* (2006.01)

(52) U.S. Cl.
CPC ....... *H01L 23/5252* (2013.01); *H01L 27/11206* (2013.01)
USPC ...................................................... 257/530

(58) Field of Classification Search
CPC .................. H01L 23/5252; H01L 27/11298
USPC ................................................... 257/530
See application file for complete search history.

(56) References Cited

U.S. PATENT DOCUMENTS

| | | | |
|---|---|---|---|
| 5,449,947 A | 9/1995 | Chen et al. | |
| 5,789,795 A | 8/1998 | Sanchez et al. | |
| 6,124,194 A | 9/2000 | Shao et al. | |
| 6,166,423 A | 12/2000 | Gambino et al. | |
| 6,251,710 B1 | 6/2001 | Radens et al. | |
| 6,335,228 B1 | 1/2002 | Fuller et al. | |
| 7,935,621 B2 | 5/2011 | Basker et al. | |
| 8,008,669 B2 | 8/2011 | Yang et al. | |
| 2007/0040276 A1* | 2/2007 | Yang et al. ............ | 257/758 |
| 2008/0157270 A1 | 7/2008 | Kim et al. | |
| 2010/0127358 A1 | 5/2010 | Tanaka | |
| 2011/0014771 A1 | 1/2011 | Dunton et al. | |
| 2011/0018093 A1 | 1/2011 | Yang et al. | |

OTHER PUBLICATIONS

Li, F., et al., "Evaluation of SiO2 Antifuse in a 3D-OTP Memory", IEEE Tranactions on Device and Materials Reliability, vol. 4, No. 3, Sep. 2004.

* cited by examiner

*Primary Examiner* — Nikolay Yushin
(74) *Attorney, Agent, or Firm* — Scully, Scott, Murphy & Presser, P.C.; Louis J. Percello, Esq.

(57) ABSTRACT

An anti-fuse structure is provided in which an anti-fuse material liner is embedded within one of the openings provided within an interconnect dielectric material. The anti-fuse material liner is located between a first conductive metal and a second conductive metal which are also present within the opening. A diffusion barrier liner separates the first conductive metal from any portion of the interconnect dielectric material. The anti-fuse structure is laterally adjacent an interconnect structure that is formed within the same interconnect dielectric material as the anti-fuse structure.

20 Claims, 4 Drawing Sheets

LOW COST ANTI-FUSE STRUCTURE

CROSS REFERENCE TO RELATED APPLICATION

This application is a continuation of U.S. patent application Ser. No. 13/552,293, filed Jul. 18, 2012 the entire content and disclosure of which is incorporated herein by reference.

BACKGROUND

The present disclosure relates to a semiconductor structure and a method of forming the same. More particularly, the present disclosure relates to a semiconductor structure including an anti-fuse structure located within an interconnect dielectric material and a method of forming the same.

Anti-fuse structures have been used in the semiconductor industry for memory related applications such as, for example, field programmable gate arrays and programmable read-only memories. Most existing anti-fuse structures have a layer of anti-fuse material sandwiched in between two disconnected conductive materials. In such structures, the anti-fuse structure/circuit initially has a very high resistance, but after programming by electrical or optical means, the high resistance structure/circuit is converted to a lower resistance state.

Prior art processes for integrating anti-fuse structures within an interconnect structure require many extra masking and etching steps which increase the overall cost of fabricating an integrated circuit. Therefore, a cost effective means for integrating an anti-fuse structure within an interconnect structure is needed which does not require any extra masking and etching steps.

SUMMARY

The present disclosure provides an anti-fuse structure in which an anti-fuse material liner is embedded within one of the openings provided within an interconnect dielectric material. The anti-fuse material liner is located between a first conductive metal and a second conductive metal which are also present within the opening. A diffusion barrier liner separates the first conductive metal from any portion of the interconnect dielectric material. The anti-fuse structure is laterally adjacent an interconnect structure that is formed within the same interconnect dielectric material as the anti-fuse structure.

In one aspect of the present disclosure, a semiconductor structure is provided. The semiconductor structure includes an interconnect dielectric material having at least one opening located therein. The semiconductor structure further includes an anti-fuse structure located within the least one opening. The anti-fuse structure includes a diffusion barrier liner located within the at least one opening and in direct contact with at least sidewall surfaces of the interconnect dielectric material, a first conductive metal plug located within the at least one opening and located on an exposed surface of the diffusion barrier liner. The first conductive metal plug includes vertical sidewall portions that extend upward from an uppermost surface of the first conductive metal plug. The anti-fuse structure further includes an anti-fuse material liner located on an exposed surface of the first conductive metal plug and an exposed surface of the vertical sidewall portions, and a second conductive metal plug located on an exposed surface of the anti-fuse material liner. In accordance with the present disclosure, each of the diffusion barrier liner, the vertical sidewall portions, the anti-fuse material liner and the second conductive metal plug have an uppermost surface that is co-planar with an uppermost surface of the interconnect dielectric material.

In another aspect of the present disclosure, a method of forming a semiconductor structure is provided. The method of the present disclosure includes forming at least one opening within an interconnect dielectric material; and forming an anti-fuse structure within the least one opening. The forming of the anti-fuse structure includes forming a contiguous layer of a diffusion barrier material on an exposed uppermost surface of the interconnect dielectric material and at least within the at least one opening; forming a contiguous layer of a first conductive metal on an exposed surface of the contiguous layer of the diffusion barrier material; performing a reflow anneal which causes portions of the contiguous layer of the first conductive metal to flow into the at least one opening forming a first conductive metal plug within the at least one opening, wherein a remaining portion of the contiguous layer of the first conductive metal which is present inside and outside the at least one opening remains in contact with the first conductive metal plug; forming a contiguous layer of an anti-fuse material on exposed surfaces of the first conductive metal plug and the remaining portion of the contiguous layer of the first conductive metal; forming a contiguous layer of a second conductive metal on an exposed surface of the contiguous layer of the anti-fuse material; and removing a portion of the contiguous layer of the second conductive metal, a portion of the contiguous layer of the anti-fuse material, remaining portions of the contiguous layer of the first conductive metal, and a portion of the contiguous layer of the diffusion barrier material that are located outside of the at least one opening.

DETAILED DESCRIPTION

Figure 1:
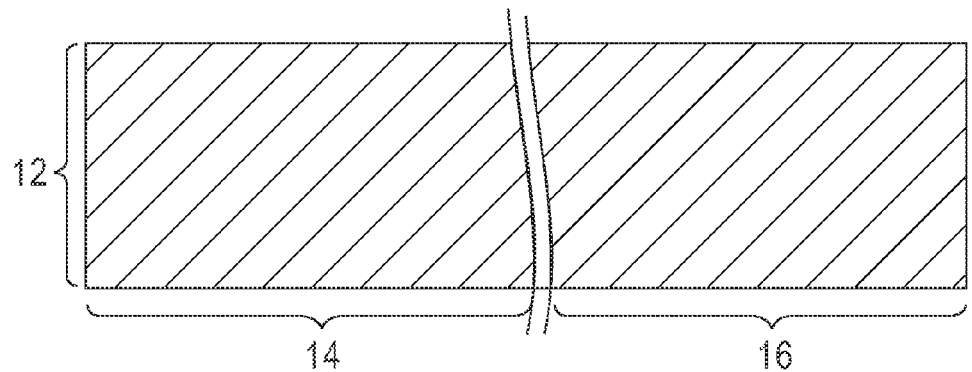
FIG. 1 is a pictorial representation (through a cross sectional view) illustrating an interconnect dielectric material including at least one interconnect area and at least one anti-fuse area.

The present disclosure, which provides a semiconductor structure including an anti-fuse structure located within an interconnect dielectric material and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Specifically, FIG. 1 illustrates an initial structure that includes an interconnect dielectric material 12 which includes at least one interconnect area 14 and at least one anti-fuse area 16. The term "interconnect area" denotes a portion of the interconnect dielectric material in which an interconnect structure is present. The interconnect structure includes conductive wiring in the form of vias and/or lines embedded within the interconnect dielectric material. The conductive wiring connects semiconductor devices that are located beneath the interconnect dielectric material to other components within an integrated circuit. The term "anti-fuse area" denotes a portion of the interconnect dielectric material in which an anti-fuse structure is present. The anti-fuse structure includes an anti-fuse material positioned between a first conductive material and a second conductive material. The anti-fuse structure initially has a very high resistance, but after programming by electrical or optical means, the high resistance material is converted to a lower resistance state.

Interconnect dielectric material 12 may be located upon a substrate (not shown in the drawings of the present application). The substrate, which is not shown, may comprise a semiconducting material, an insulating material, a conductive material or any combination thereof. When the substrate is comprised of a semiconducting material, any semiconducting material such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs). When the substrate comprises a semiconducting material, one or more semiconductor devices such as, for example, complementary metal oxide semiconductor (CMOS) devices can be fabricated thereon.

When the substrate is an insulating material, the insulating material can be an organic insulator, an inorganic insulator or a combination thereof including multilayers. When the substrate is a conductive material, the substrate may include, for example, polySi, a conductive metal, alloys of at least two conductive metals, a metal silicide, a metal nitride or combinations thereof including multilayers. When the substrate comprises a combination of an insulating material and a conductive material, the substrate may represent a first interconnect level of a multilayered interconnect structure.

The interconnect dielectric material 12 can include any interlevel or intralevel dielectric including inorganic dielectrics or organic dielectrics. In one embodiment, the interconnect dielectric material 12 may be non-porous. In another embodiment, the interconnect dielectric material 12 may be porous. Porous dielectrics are advantageous since such dielectric materials have lower dielectric constants than an equivalent non-porous dielectric material. Some examples of suitable dielectrics that can be used as the interconnect dielectric material 12 include, but are not limited to, $SiO_2$, silsesquioxanes, C doped oxides (i.e., organosilicates) that include atoms of Si, C, O and H, thermosetting polyarylene ethers, or multilayers thereof. When a multilayered interconnect dielectric material structure is employed, the various dielectric material layers are typically in direct contact with each other. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the interconnect dielectric material 12 has a dielectric constant that is about 4.0 or less. In another embodiment, the interconnect dielectric material 12 has a dielectric constant of about 2.8 or less. All dielectric constants mentioned herein are relative to a vacuum, unless otherwise noted. The interconnect dielectric material 12 that is employed in the present disclosure generally has a lower parasitic crosstalk as compared with dielectric materials that have a dielectric constant of greater than 4.0. The thickness of the interconnect dielectric material 12 may vary depending upon the dielectric material used as well as the exact number of dielectrics layers within the interconnect dielectric material 12. Typically, and for normal interconnect structures, the interconnect dielectric material 12 has a thickness from 50 nm to 1000 nm.

Figure 2:
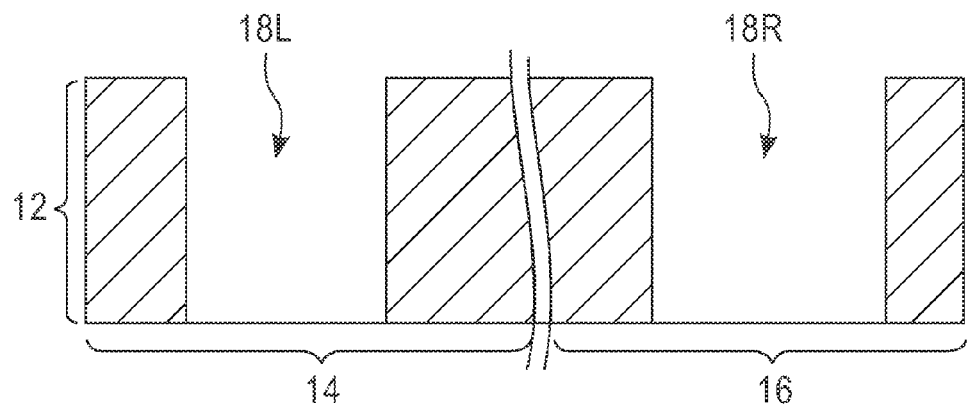
FIG. 2 is a pictorial representation (though a cross sectional view) illustrating the structure of FIG. 1 after forming at least one first opening within the interconnect dielectric material in the at least one interconnect area and at least one second opening within the interconnect dielectric material in the at least one anti-fuse area, wherein the at least one first opening and the at least one second opening are formed simultaneously and are laterally adjacent to each other.

Referring now to FIG. 2, there is shown the initial structure of FIG. 1 after forming at least one first opening 18L within the interconnect dielectric material 12 in the interconnect area 14 and at least one second opening 18R within the interconnect dielectric material 12 in the anti-fuse area 16. The at least one first opening 18L and the at least one second opening 18R are formed simultaneously and represent a complementary pair of openings that are laterally adjacent to each other, but located within different areas of the interconnect dielectric material 12. As shown, the at least one first opening 18L has an uppermost portion that is coincident to an uppermost portion of the at least one second opening 18R. Also, the at least one first opening 18L has a bottommost portion that is coincident to a bottommost portion of the at least one second opening 18R.

Although a single first opening 18L and a single second opening 18R are shown in the drawings, a plurality of such openings can be formed. When a plurality of first and second openings 18L, 18R are formed, each corresponding first opening 18L and second opening 18R can have a same or a different depth. In some embodiments (not shown), the bottommost surface of the first and second openings 18L, 18R does not extend entirely through the interconnect dielectric material 12. In other embodiments (and as shown in FIG. 2), the first and second openings 18L, 18R extend entirely through the interconnect dielectric material 12. Also, and when a plurality of first and second openings 18L, 18R are formed, each first and second opening 18L, 18R can be of a same type or of a different type.

The first and second openings 18L, 18R can be formed into the interconnect dielectric material 12 utilizing lithography and etching. The lithographic process can include forming a photoresist (not shown) atop the interconnect dielectric material 12, exposing the photoresist to a desired pattern of radiation and developing the exposed photoresist utilizing a conventional resist developer. The pattern is then transferred into the underlying interconnect dielectric material 12 by etching. The etching can include a dry etching process (such as, for example, reactive ion etching, ion beam etching, plasma etching or laser ablation), and/or a wet chemical etching process. Typically, reactive ion etching is used in providing the first and second openings 18L, 18R. After patterning the underlying interconnect dielectric material 12, the patterned photoresist can be removed utilizing a conventional stripping process such as, for example, ashing.

In one embodiment and prior to patterning the interconnect dielectric material 12, a hardmask (not shown) can be formed directly on an uppermost surface of the interconnect dielectric material 12. When employed, the hard mask can include an oxide, a nitride, an oxynitride or any multilayered combination thereof. In one embodiment, the hard mask is an oxide such as silicon dioxide, while in another embodiment the hard mask is a nitride such as silicon nitride. The hard mask can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask can be formed by one of thermal oxidation, and thermal nitridation.

When employed, the thickness of the hard mask is from 5 nm to 100 nm. Other thicknesses that are greater than or lesser than the thickness range mentioned above can also be employed for the hard mask. When a hard mask is present, a first etch is performed to transfer the pattern provided in the photoresist to the hard mask, the patterned photoresist is then removed by an ashing step, and thereafter, a second etch is performed to transfer the pattern from the patterned hard mask into the underlying interconnect dielectric material 12. In embodiments in which a hard mask is present, the hard mask can be removed from atop the interconnect dielectric material 12 after the first and second openings 18L, 18R are formed therein.

The first opening 18L and the second opening 18R that are formed into the interconnect dielectric material 12 can be a via opening, a line opening, and/or combined via/line opening. In FIG. 2, and by way of an example, a line opening is shown for the first opening 18L and the second opening 18R. When combined via/line openings are formed, the individual via opening and line opening of a combined via and line opening are in communication with each other. When a combined via and line opening is formed, a second iteration of lithography and etching can be used in forming the same. A via opening can be distinguished from a line opening, in that a via opening has a width that is less than a width of the line opening.

The width of each first opening 18L and second opening 18R may vary depending on the type of opening formed and should be sufficiently small so as to allow partial filling of the opening by a metal reflow process. For a via opening, the width of the via opening can be from 10 nm to 200 nm. For line openings, the width of the line opening can be from 20 nm to 2000 nm.

Figure 3:
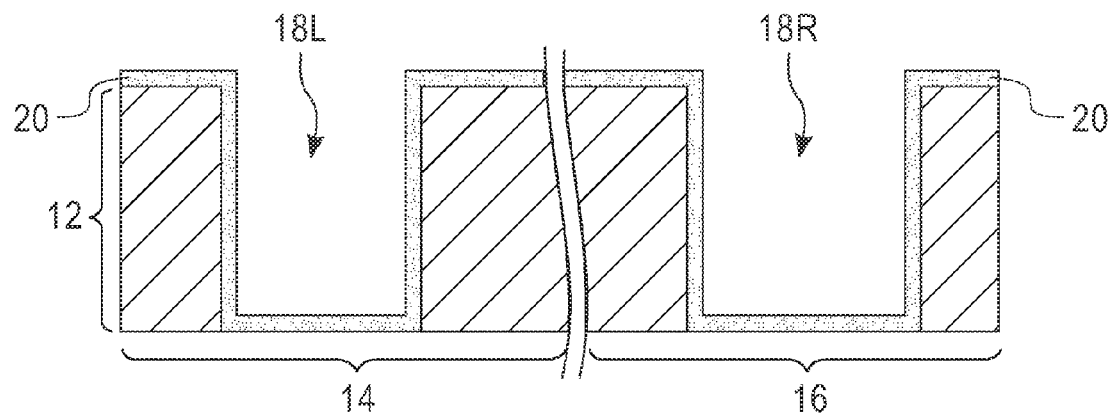
FIG. 3 is a pictorial representation (through a cross sectional view) illustrating the structure of FIG. 2 after forming at least a contiguous layer of a diffusion barrier material within the at least one first opening and the at least one second opening.

Referring now to FIG. 3, there is illustrated the structure of FIG. 2 after forming at least a contiguous layer of a diffusion barrier material 20 on all exposed surfaces of the structure including within each first opening 18L and second opening 18R and along the uppermost surface of interconnect dielectric material 12. The terms "contiguously" or "contiguous" denotes that a particular layer such as the diffusion barrier material does not include any breaks therein. The contiguous layer of diffusion barrier material 20 within the first and second openings 18L, 18R does not completely fill each opening, but rather the contiguous layer of diffusion barrier material 20 is present along the sidewalls and bottommost surface of each first and second openings 18L, 18R. Within each first and second opening 18L, 18R, the contiguous layer of diffusion barrier material 20 is present at least on sidewall surfaces of the interconnect dielectric material 12.

The contiguous layer of diffusion barrier material 20 includes Co, Ir, Pt, Pd, Ta, TaN, Ti, TiN, Ru, RuN, RuTa, RuTaN, W, WN or any other material that can serve as a barrier to prevent a conductive material from diffusing there through. The thickness of the contiguous layer of diffusion barrier material 20 may vary depending on the deposition process used as well as the material employed. In one embodiment, the contiguous layer of diffusion barrier material 20 has a thickness from 2 nm to 50 nm. In another embodiment, the contiguous layer of diffusion barrier material 20 has a thickness from 5 nm to 20 nm.

The contiguous layer of diffusion barrier material 20 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

In some embodiments (now shown), an optional plating seed layer can be formed on an exposed uppermost surface of the contiguous layer of diffusion barrier material 20. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Figure 4:
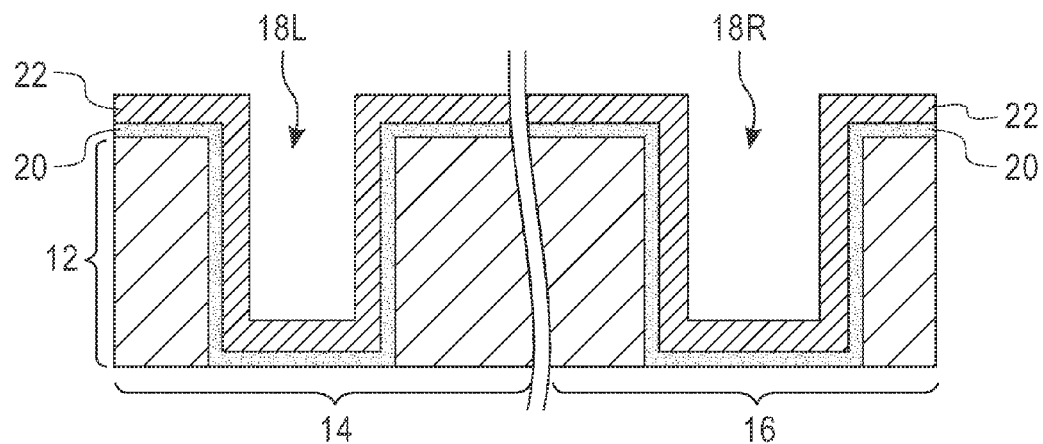
FIG. 4 is a pictorial representation (through a cross sectional view) illustrating the structure of FIG. 3 after formation of a contiguous layer of a first conductive metal atop the contiguous layer of diffusion barrier material.

Referring now to FIG. 4, there is illustrated the structure of FIG. 3 after forming a contiguous layer of a first conductive metal 22 atop the contiguous layer of diffusion barrier material 20. As such, the contiguous layer of first conductive metal 22 will be present inside and outside of each of the first and second openings 18L, 18R within the interconnect area 14 and the anti-fuse area 16 of the structure. The contiguous layer of first conductive metal 22 within the first and second openings 18L, 18R does not completely fill each opening, but rather the contiguous layer of first conductive metal 22 is present along the sidewalls and bottommost surface of each first and second openings 18L, 18R.

The contiguous layer of first conductive metal 22 can include a conductive metal, an alloy comprising at least two conductive metals, a conductive metal silicide or combinations thereof. In one embodiment, the contiguous layer of first conductive metal 22 is a conductive metal such as, for example, Cu, W or Al. In another embodiment, the contiguous layer of first conductive metal 22 is comprised of a Cu alloy (such as AuCu or AlCu or CuMn).

The contiguous layer of conductive metal 22 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The contiguous layer of first conductive metal 22 that is formed at this point of the present disclosure must be thick enough such that during a subsequent reflow anneal each of the first and second openings 18L, 18R is partially filled with a first conductive metal plug. It is noted that the first conductive metal plug comprises the conductive material of the contiguous layer of first conductive metal 22 which was subjected to the reflow anneal. In one embodiment, the contiguous layer of first conductive metal 22 has a thickness from 2 nm to 80 nm. In another embodiment, the contiguous layer of first conductive metal 22 has a thickness from 4 nm to 50 nm.

Figure 5:
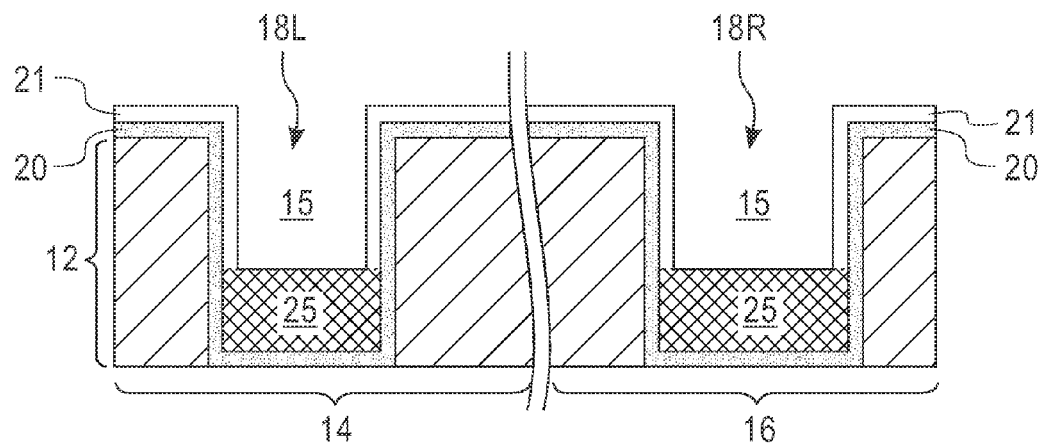
FIG. 5 is a pictorial representation (through a cross sectional view) illustrating the structure of FIG. 4 after performing a reflow anneal which partially fills the at least one first and second openings with a first conductive metal plug.

Referring now to FIG. 5, there is illustrated the structure of FIG. 4 after performing a reflow anneal. During the reflow anneal, a portion of the contiguous layer of first conductive metal 22 that is located outside the first and second openings 18L, 18R flows into each opening filling at least a portion of the first and second openings 18L, 18R with first conductive metal plug 25. A cavity 15 remains in each of the first and second openings 18L, 18R which does not extend the entire height of each first and second opening 18L, 18R. As shown in FIG. 5, a remaining portion 21 of the contiguous layer of first conductive metal 22 is located inside and outside of the first and second openings 18L, 18R. As also shown in FIG. 5, the remaining portion 21 of the contiguous layer of first conductive metal 22 is in direct physical contact with the first conductive metal plug 25 that is formed within each of the first and second openings 18L, 18R. As mentioned above, the first conductive metal plug 25 comprises the conductive material of the contiguous layer of first conductive metal 22 which was subjected to the reflow anneal. As shown in the drawings, no interface separates the remaining portion 21 of the contiguous layer of first conductive metal 22 from that of the first conductive metal plug 25 since the remaining portion 21 of the contiguous layer of first conductive metal 22 and the first conductive metal plug 25 are both composed of the same material and no other material is formed between elements 21 and 25 in the present disclosure. As such, the first conductive metal plug 25 and the remaining portion 21 of the contiguous layer of first conductive metal 22 are of unitary construction, i.e., elements 21 and 25 are one piece. In the drawings, a dashed line is used to emphasize the location of element 21 in relationship to element 25.

In one embodiment, the reflow anneal can be performed at a temperature from 150° C. to 400° C. for a time period from 5 minutes to 500 minutes. In another embodiment, the reflow anneal can be performed at a temperature from 200° C. to 300° C. for a time period from 20 minutes to 100 minutes. In one embodiment, the reflow anneal can be performed in a hydrogen-containing ambient. By "hydrogen-containing ambient" it is meant an environment that includes hydrogen. In one embodiment, the hydrogen-containing ambient may include a mixture of hydrogen and nitrogen. In another embodiment, the reflow anneal can be formed in a nitrogen-containing ambient which includes at least nitrogen. In one embodiment, the nitrogen-containing ambient may include nitrogen. Without wishing to be bound by any theory, it is believed that the during the reflow anneal, the surface energy of the structure is reduced in such a manner that a majority, but not all, of the contiguous layer of first conductive metal 22 that is located outside the first and second openings 18L, 18R, i.e., on the field region of the structure, flows into the small features of the first and second openings 18L, 18R, and partially fills the first and second openings 18L, 18R with a first conductive metal plug 25.

Figure 6:
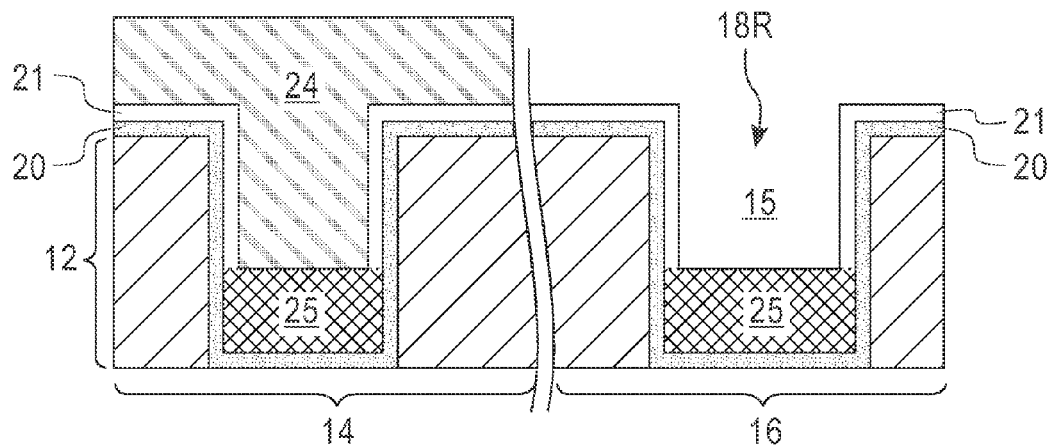
FIG. 6 is a pictorial representation (through a cross sectional view) illustrating the structure of FIG. 5 after forming a mask within the at least one interconnect area of the structure.

Referring now to FIG. 6, there is illustrated the structure of FIG. 5 after forming a mask 24 within the at least one interconnect area 14 of the structure. As shown, the mask 24 covers the entirety of the at least one interconnect area 14 while leaving the at least one anti-fuse area 16 exposed. The mask 24 has a bottommost surface that contacts the first conductive metal plug 25 within the at least one interconnect area 14 of the structure.

In one embodiment of the present disclosure, the mask 24 may comprise a hard mask material such as for example, silicon dioxide, silicon nitride, silicon oxynitride or any multilayered combination thereof. In another embodiment, the mask 24 may comprise any photoresist material.

The mask 24 can be formed by first forming a blanket layer of mask material within both the at least one interconnect area 14 and the at least one anti-fuse area 16. The blanket layer of mask material can then be patterned such that the mask material is removed from within the at least one anti-fuse area 16, while leaving mask material within the at least one interconnect area 14. The blanket layer of mask material can be formed by a deposition process such as, for example, chemical vapor deposition (CVD), plasma enhanced chemical vapor deposition (PECVD), chemical solution deposition, evaporation, physical vapor deposition (PVD) and spin-on coating. The patterning of the blanket layer of mask material may comprise lithography and etching. In embodiments in which a hard mask material is employed as mask 24, a separate photoresist is employed atop the blanket layer of hard mask material prior to lithography. Lithography includes exposing a photoresist material to a desired pattern of radiation and then developing the exposed photoresist material. In some embodiments, the pattern can be transferred into the blanket layer of mask material utilizing an etching process such as a dry etching or wet chemical etching process. The pattern transfer utilizing one of the etching process is typically required when the mask material is other than a photoresist material. When the mask material is a photoresist material, the lithography step can be used to directly pattern the blanket layer of photoresist material into mask 24.

Figure 7:
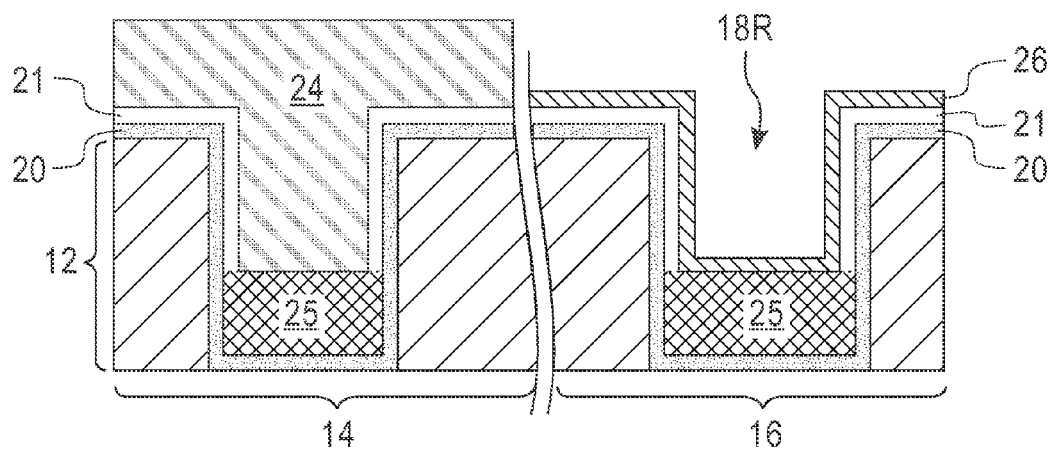
FIG. 7 is a pictorial representation (through a cross sectional view) illustrating the structure of FIG. 6 after forming a contiguous layer of an anti-fuse material in the at least one anti-fuse area of the structure, wherein a portion of the contiguous layer of anti-fuse material is present within the at least one second opening.

Referring now to FIG. 7, there is illustrated the structure of FIG. 6 after forming a contiguous layer of an anti-fuse material 26 within the at least one anti-fuse area 16 of the structure. No anti-fuse material 26 forms on the active components within the at least one interconnect area 14 because of the presence of the mask 24. The contiguous layer of anti-fuse material 26 is formed on an exposed surface of the first conductive metal plug 25 and all exposed surfaces of the remaining portion 21 of the contiguous layer of first conductive metal 22.

The contiguous layer of anti-fuse material 26 includes an insulator or semiconductor material, which makes the original anti-fuse structure/circuit have an initial high electrical resistance. This high resistance structure/circuit can be programmed into a lower resistance by application of certain process such as, for example, an electrical pulse or a laser. By "high" and "low" resistances, it is meant an electrical resistance reduction of 50% or greater. Examples of anti-fuse materials that can be used as the contiguous layer of anti-fuse material 26 include, but are not limited to, silicon dioxide, hafnium dioxide, nickel oxide, tantalum oxide, copper oxide, amorphous silicon carbide, amorphous silicon, diamond like carbon and any combination thereof including multilayers.

The contiguous layer of anti-fuse material 26 can be formed utilizing a deposition process including for example, chemical vapor deposition (CVD), plasma enhanced chemical vapor deposition (PECVD), atomic layer deposition (ALD), physical vapor deposition (PVD), sputtering, chemical solution deposition and plating.

The thickness of the contiguous layer of anti-fuse material 26 may vary depending on type of anti-fuse material employed as well as the technique used in forming the same. In one embodiment, the contiguous layer of anti-fuse material 26 has a thickness from 0.5 nm to 50 nm. In another embodiment, the contiguous layer of anti-fuse material 26 has a thickness from 1 nm to 20 nm.

Figure 8:
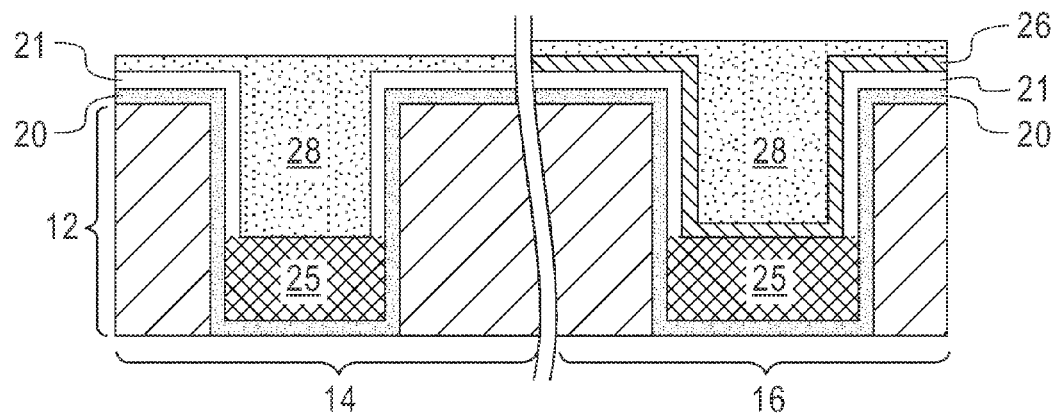
FIG. 8 is a pictorial representation (through a cross sectional view) illustrating the structure of FIG. 7 after removing the mask within the at least one interconnect area of the structure and forming a contiguous layer of a second conductive metal within both the at least one interconnect area and the at least one anti-fuse area.

Referring now to FIG. 8, there is illustrated the structure of FIG. 7 after removing mask 24 and then forming a contiguous layer of a second conductive metal 28 on all exposed surfaces structure. In the at least one interconnect area 14, a portion of the contiguous layer of second conductive metal 28 entirely fills the cavity 15 that remained within the first opening 18L, while another portion of the contiguous layer of second conductive metal 28 within the at least one interconnect area 14 is located outside the first opening 18L. In the at least one anti-fuse area 16, a portion of the contiguous layer of second conductive metal 28 is formed atop the contiguous layer of anti-fuse material 26 filling the remaining portion of the cavity 15 that remained within the second opening 18R, while another portion of the contiguous layer of second conductive metal 28 within the at least one interconnect area 16 is located outside the second opening 18R.

In one embodiment, mask 24 can be removed from the structure utilizing an etching process such as, for example, a chemical wet etch. In another embodiment, the mask 24 can be removed from the structure utilizing a resist ashing process. In yet another embodiment, the mask 24 can be removed by a planarization process such as, for example, chemical mechanical planarization and/or grinding.

The contiguous layer of second conductive metal 28 comprises one of the conductive materials mentioned above for the contiguous layer of first conductive metal 22. In one embodiment of the present disclosure, the contiguous layer of second conductive metal 28 comprises a same conductive metal as the contiguous layer of first conductive metal 22. In another embodiment of the present disclosure, the contiguous layer of second conductive metal 28 comprises a different conductive metal as the contiguous layer of first conductive metal 22.

The contiguous layer of second conductive metal 28 may be formed utilizing one of the techniques mentioned above in forming the contiguous layer of first conductive metal 22. Alternatively, the contiguous layer of second conductive metal 28 can be formed by other deposition techniques such as, for example, PVD, CVD, and ECP (Electrochemical plating). In one embodiment, the contiguous layer of second conductive metal 28 that is formed at this point of the present disclosure has a thickness from 2 nm to 100 nm. In another embodiment, the contiguous layer of second conductive metal 28 has a thickness from 10 nm to 50 nm.

Figure 9:
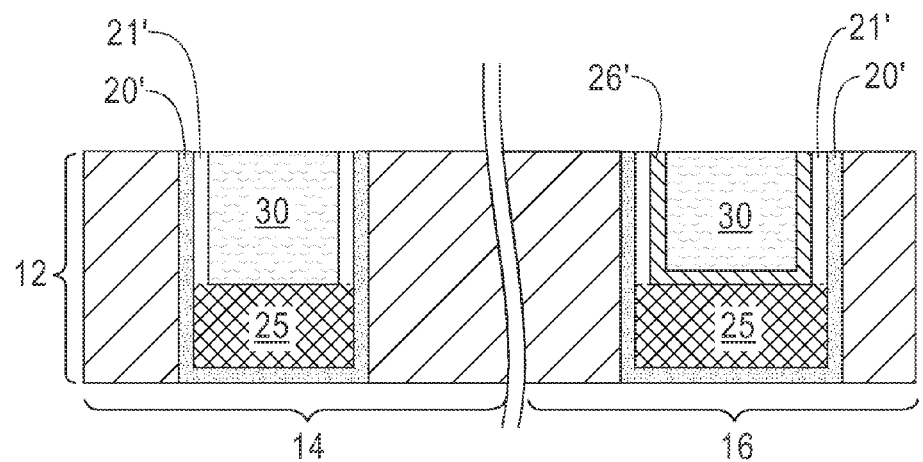
FIG. 9 is a pictorial representation (through a cross sectional view) illustrating the structure of FIG. 8 after performing a planarization process.

Referring now to FIG. 9, there is illustrated the structure of FIG. 8 after performing a planarization process. The planarization process which can be employed in the present disclosure includes, for example, chemical mechanical polishing (CMP) and/or grinding. The planarization process removes all materials that are located on the uppermost surface of the interconnect dielectric material 12 and that are present outside of the first and second openings 18L, 18R. The portion of the contiguous layer of second conductive metal 28 that remains within the first and second openings 18L, 18R after the planarization process is referred to herein as a second conductive metal plug 30. The portion of the contiguous layer of anti-fuse material 26 that remains within the second opening 18R is referred to herein as an anti-fuse material liner 26'. The portion of the contiguous diffusion barrier material 20 that remains within the first and second openings 18L, 18R is referred to herein as diffusion barrier liner 20'. Also, present within the first and second openings 18L, 18R, after the planarization is performed, is a vertical sidewall portion of the remaining portion 21 of the contiguous layer of first conductive metal 22 that was left within the openings 18L, 18R after the reflow anneal. This vertical sidewall portion of the remaining portion 21 of the contiguous layer of first conductive metal 22 that was left within the openings 18L, 18R after the reflow anneal is labeled as 21' in the drawing and can be refer to just as a vertical sidewall portion of the first conductive metal plug 25. Each vertical sidewall portion extends from and uppermost surface of the first conductive metal plug 25. The first conductive metal plug 25 and the vertical sidewall portions 21' are of unitary construction, i.e., elements 21' and 25 are one piece. In the drawings, a dashed line is used to emphasize the location of element 21' in relationship to element 22.

The diffusion barrier liner 20' and the anti-fuse material liner 26' are U-shaped. By "U-shaped" it is meant that the particular liner material includes two vertical portions which upward extend from a horizontal connecting portion.

Specifically, FIG. 9 illustrates a semiconductor structure in accordance with an embodiment of the present disclosure. This structure includes interconnect dielectric material 12 having at least one opening 18R located therein. The structure further includes an anti-fuse structure located within the least one opening 18R. The anti-fuse structure includes diffusion barrier liner 20' located within the at least one opening 18R and in direct contact with at least sidewall surfaces of the interconnect dielectric material 12, first conductive metal plug 25 located within the at least one opening 18R and located on an exposed surface of the diffusion barrier liner 20'. The first conductive metal plug 25 includes vertical sidewall portions (i.e., element 21') that extend upward from an uppermost surface of the first conductive metal plug 25. The anti-fuse structure further includes an anti-fuse material liner 26' located on an exposed surface of the first conductive metal plug 25 and an exposed surface of the vertical sidewall portions 21', and a second conductive metal plug 30 is located on an exposed surface of the anti-fuse material liner 26'. As shown in FIG. 9, each of the diffusion barrier liner 20', the vertical sidewall portions 21', the anti-fuse material liner 26', and the second conductive metal plug 30 have an uppermost surface that is co-planar with an uppermost surface of the interconnect dielectric material 12.

An interconnect structure is located within the same interconnect dielectric material 12 and the interconnect structure is laterally adjacent to the anti-fuse structure. The interconnect structure includes a portion of the interconnect dielectric material which includes at least one opening 18L. The at least one opening 18L is filled with a diffusion barrier liner 20' located within the at least one opening 18L and in direct contact with at least sidewall surfaces of the interconnect dielectric material 12, first conductive metal plug 25 located within the at least one opening 18L and located on an exposed surface of the diffusion barrier liner 20'. The first conductive metal plug 25 includes vertical sidewall portions (i.e., element 21') that extend upward from an uppermost surface of the first conductive metal plug 25. The interconnect structure further includes a second conductive metal plug 30 located on an exposed surface of the first conductive metal plug 25 and the exposed surface of each vertical sidewall portions 21'. As shown in FIG. 9, left hand side, each of the diffusion barrier liner 20', the vertical sidewall portions 21', and the second conductive metal plug 30 have an uppermost surface that is co-planar with an uppermost surface of the interconnect dielectric material 12.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   an interconnect dielectric material having at least one opening located therein, said at least one opening extends from a topmost surface of said interconnect dielectric material to a bottommost surface of said interconnect dielectric material; and
   an anti-fuse structure located within the least one opening, wherein the anti-fuse structure comprises:
     a diffusion barrier liner located within the at least one opening and in direct contact with at least sidewall surfaces of the interconnect dielectric material and having a bottommost horizontal surface that is coplanar with said bottommost surface of said interconnect dielectric material;
     a first conductive metal plug located within the at least one opening and located on an exposed surface of the diffusion barrier liner, wherein said first conductive metal plug includes vertical sidewall portions that extend upward from an uppermost surface of the first conductive metal plug;
     an anti-fuse material liner located on an exposed surface of the first conductive metal plug and an exposed surface of the vertical sidewall portions; and
     a second conductive metal plug located on an exposed surface of the anti-fuse material liner, wherein each of the diffusion barrier liner, the vertical sidewall portions, the anti-fuse material liner, and the second conductive metal plug have an uppermost surface that is co-planar with an uppermost surface of the interconnect dielectric material.

2. The semiconductor structure of claim 1 wherein the interconnect dielectric material has a dielectric constant of about 4.0 or less.

3. The semiconductor structure of claim 2, wherein said interconnect dielectric material comprises $SiO_2$, a silsesquioxane, a C doped oxide that include atoms of Si, C, O and H, a thermosetting polyarylene ether, or multilayers thereof.

4. The semiconductor structure of claim 3, wherein said interconnect dielectric material is porous.

5. The semiconductor structure of claim 1, wherein said diffusion barrier liner comprises Co, Ir, Pt, Pd, Ta, TaN, Ti, TiN, Ru, RuN, RuTa, RuTaN, W, or WN.

6. The semiconductor structure of claim 1, wherein said first conductive metal plug and said vertical sidewall portions are comprised of a same conductive metal and are of unitary construction.

7. The semiconductor structure of claim 6, wherein said first conductive metal plug and said vertical sidewall portions comprise a conductive metal, an alloy comprising at least two conductive metals, a conductive metal silicide or combinations thereof.

8. The semiconductor structure of claim 7, wherein said first conductive metal plug and said vertical sidewall portions comprise a conductive metal, and said conductive metal is selected from the group consisting of Cu, W, Al and an alloy thereof.

9. The semiconductor structure of claim 1, wherein said anti-fuse material liner comprises a dielectric material selected from at least one of silicon dioxide, hafnium dioxide, nickel oxide, tantalum oxide, copper oxide, amorphous silicon carbide, amorphous silicon, and diamond like carbon.

10. The semiconductor structure of claim 1, wherein second conductive metal plug comprises a same conductive metal as said first conductive metal plug and said vertical sidewall portions.

11. The semiconductor structure of claim 1, wherein second conductive metal plug comprises a different conductive metal as said first conductive metal plug and said vertical sidewall portions.

12. The semiconductor structure of claim 1, wherein second conductive metal plug comprises Cu, W, Al or an alloy thereof.

13. The semiconductor structure of claim 1, wherein said anti-fuse material liner separates the second conductive metal plug from both the first conductive metal plug and the vertical sidewall portions.

14. The semiconductor structure of claim 1, wherein said diffusion barrier liner and said anti-fuse material liner are both U-shaped.

15. The semiconductor structure of claim 1, further comprising an interconnect structure located within a portion of the interconnect dielectric material that lies laterally adjacent the interconnect dielectric material including the anti-fuse structure.

16. The semiconductor structure of claim 15, wherein said interconnect structure is present within at least one other opening, said at least one other opening is filled with another portion of the diffusion barrier liner, another portion of the first conductive metal plug and other vertical sidewall portions that extend upward from an uppermost surface of the another portion of first conductive metal plug, and another portion of the second conductive metal plug.

17. The semiconductor structure of claim 16, wherein the another portion of the diffusion barrier liner, the other vertical sidewall portions, and the another portion of the second conductive metal plug have an uppermost surface that is co-planar with an uppermost surface of the interconnect dielectric material.

18. The semiconductor structure of claim 16 wherein said at least one opening and said at least one other opening have a same depth.

19. A semiconductor structure comprising:
   an interconnect dielectric material having at least one opening located therein; and
   an anti-fuse structure located within the least one opening, wherein the anti-fuse structure comprises:

a diffusion barrier liner located within the at least one opening and in direct contact with at least sidewall surfaces of the interconnect dielectric material;

a first conductive metal plug located within the at least one opening and located on an exposed surface of the diffusion barrier liner, wherein said first conductive metal plug includes vertical sidewall portions that extend upward from an uppermost surface of the first conductive metal plug;

an anti-fuse material liner located on an exposed surface of the first conductive metal plug and an exposed surface of the vertical sidewall portions, wherein said anti-fuse material liner comprises a semiconductor material; and a second conductive metal plug located on an exposed surface of the anti-fuse material liner, wherein each of the diffusion barrier liner, the vertical sidewall portions, the anti-fuse material liner, and the second conductive metal plug have an uppermost surface that is co-planar with an uppermost surface of the interconnect dielectric material.

20. A semiconductor structure comprising:

an interconnect dielectric material having at least one opening located therein, said at least one opening extends only partially through said interconnect dielectric material; and an anti-fuse structure located within the least one opening, wherein the anti-fuse structure comprises:

a diffusion barrier liner located within the at least one opening and in direct contact with at least sidewall surfaces of the interconnect dielectric material and having a bottommost horizontal surface that is directly physical contact with a subsurface portion of said interconnect dielectric material that lies beneath a topmost surface of said interconnect dielectric material and above a bottommost surface of said interconnect dielectric material;

a first conductive metal plug located within the at least one opening and located on an exposed surface of the diffusion barrier liner, wherein said first conductive metal plug includes vertical sidewall portions that extend upward from an uppermost surface of the first conductive metal plug;

an anti-fuse material liner located on an exposed surface of the first conductive metal plug and an exposed surface of the vertical sidewall portions; and a second conductive metal plug located on an exposed surface of the anti-fuse material liner, wherein each of the diffusion barrier liner, the vertical sidewall portions, the anti-fuse material liner, and the second conductive metal plug have an uppermost surface that is co-planar with an uppermost surface of the interconnect dielectric material.

* * * * *